(12) United States Patent
Cao

(10) Patent No.: US 8,073,989 B2
(45) Date of Patent: Dec. 6, 2011

(54) PRINTER INTERFACE DETECTION DEVICE

(75) Inventor: Xiang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 98 days.

(21) Appl. No.: 12/630,853

(22) Filed: Dec. 4, 2009

(65) Prior Publication Data

US 2011/0072169 A1    Mar. 24, 2011

(30) Foreign Application Priority Data

Sep. 18, 2009    (CN) .......................... 2009 1 0307305

(51) Int. Cl.
*G06F 3/00* (2006.01)
(52) U.S. Cl. ................. 710/19; 710/15; 710/17; 710/18
(58) Field of Classification Search .................... None
See application file for complete search history.

(56) References Cited

U.S. PATENT DOCUMENTS

| | | | | |
|---|---|---|---|---|
| 4,694,408 A | * | 9/1987 | Zaleski ........................... | 701/33 |
| 5,157,782 A | * | 10/1992 | Tuttle et al. .................... | 714/45 |
| 5,649,001 A | * | 7/1997 | Thomas et al. ............ | 379/93.07 |
| 5,781,720 A | * | 7/1998 | Parker et al. ............... | 714/38.11 |
| 5,953,372 A | * | 9/1999 | Virzi ............................. | 375/224 |
| 6,263,385 B1 | * | 7/2001 | Gulick et al. ................. | 710/313 |
| 6,570,385 B1 | * | 5/2003 | Roberts et al. ............... | 324/378 |
| 2005/0030039 A1 | * | 2/2005 | Roberts et al. ............... | 324/380 |
| 2006/0075318 A1 | * | 4/2006 | Romero et al. .............. | 714/738 |
| 2006/0107154 A1 | * | 5/2006 | Bansal et al. ................. | 714/738 |
| 2009/0265580 A1 | * | 10/2009 | Lee et al. ....................... | 714/27 |
| 2010/0017658 A1 | * | 1/2010 | Yang et al. ..................... | 714/35 |

OTHER PUBLICATIONS

Peter H. Anderson "Use of a PC Printer Port for Control and Data Acquisition", Jun. 3, 2008, Department of Electricical Engineering, Morgan State University.*
Lammert Bies "Parallel cables pinout and port info", Feb. 27, 2009.*
"Debug Card USB + LPT + Mini PCI Ports".*
Justen Everage "How to Test a Printer Port With a Volt Meter", Wake Forest University.*

* cited by examiner

*Primary Examiner* — Henry Tsai
*Assistant Examiner* — Jing-Yih Shyu
(74) *Attorney, Agent, or Firm* — Altis Law Group, Inc.

(57) ABSTRACT

A printer interface detection device includes a printer interface connected to a printer interface of a computer to be detected, a microcontroller, and an indicator. The printer interface includes a number of input/output (I/O) pins and a data signal pin connected to the corresponding pins of the microcontroller. The microcontroller outputs a plurality of printing status signals to the computer according to instructions from the computer. The computer compares whether the number of printing statuses are consistent with printing statuses stored in the computer, to determine whether a printing function of the printer interface of the computer is normal. When the printing function of the printer interface of the computer is normal, the indicator is lit.

4 Claims, 3 Drawing Sheets

PRINTER INTERFACE DETECTION DEVICE

BACKGROUND

1. Technical Field

The present disclosure relates to detection devices, and particularly to a printer interface detection device.

2. Description of Related Art

Nowadays, as more databases and computer networks are interconnected, distributed multiple data systems and destinations are used to store information. Proper functioning of the printer interface of a computer becomes very important in such distributed resources. Generally, when a printer interface of a computer is tested for its functionality, a corresponding printer needs to be connected, which is inconvenient in a distributed arrangement.

DETAILED DESCRIPTION

Figure 1:
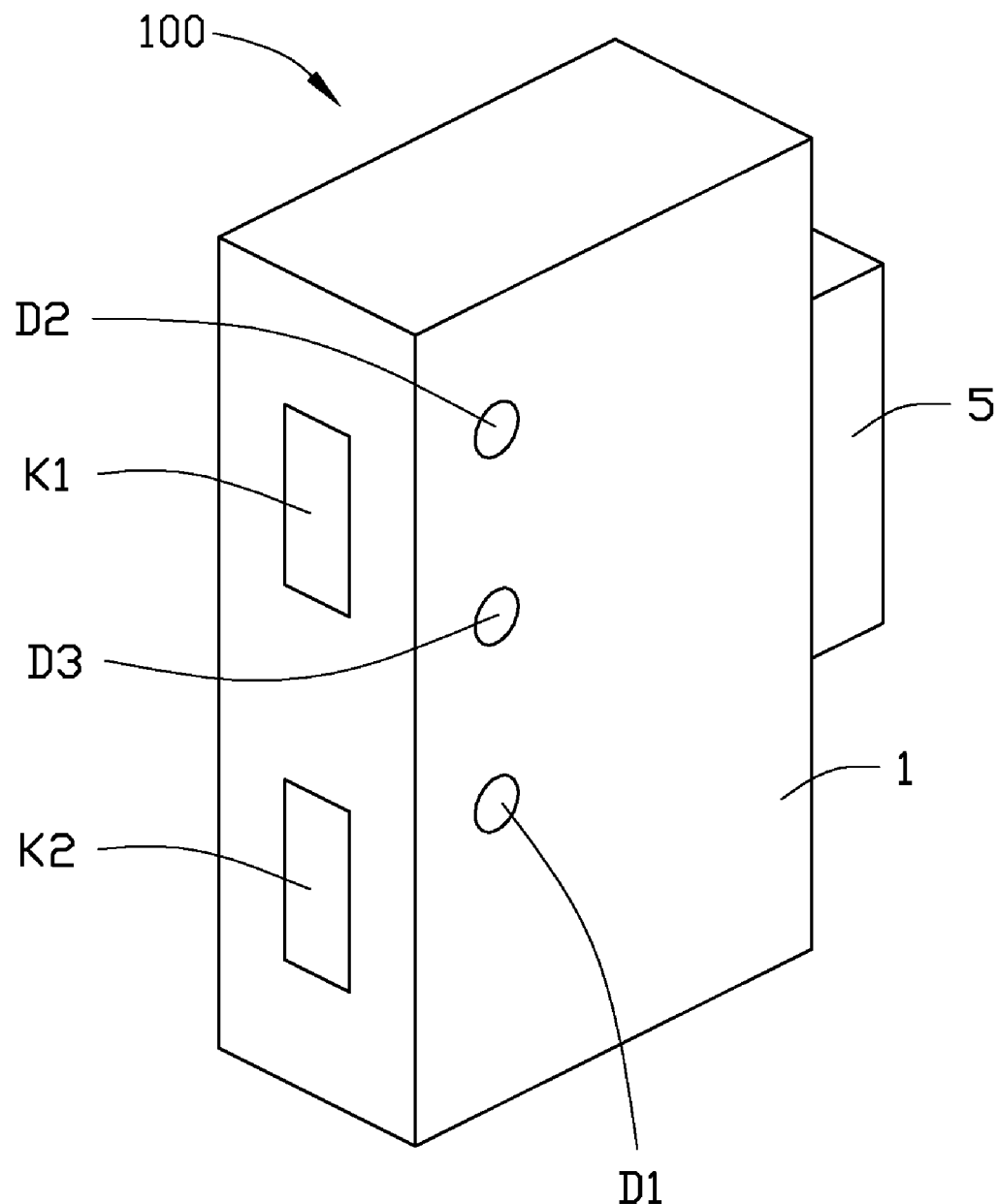
FIG. 1 is a schematic, isometric view of one embodiment of a printer interface detection device.
Figure 2:
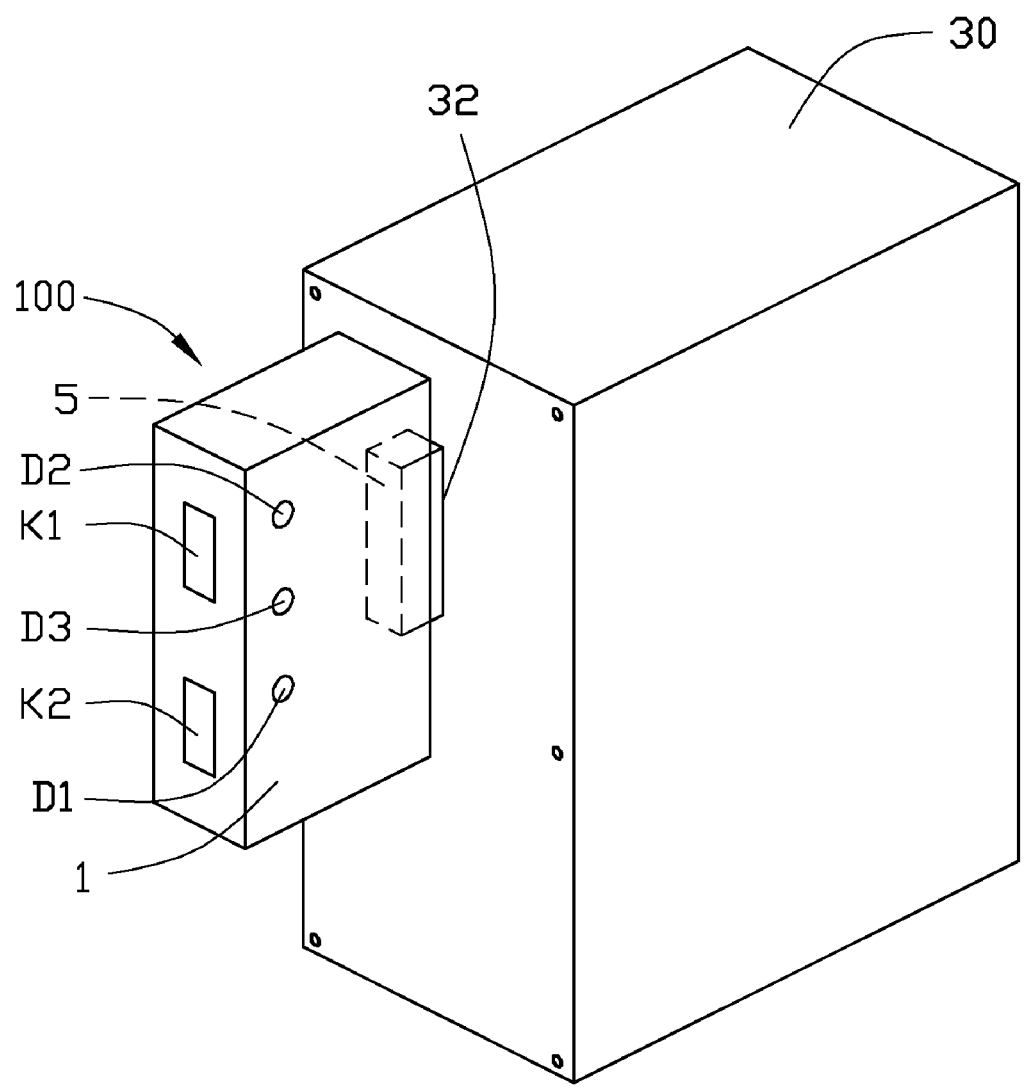
FIG. 2 is a schematic, isometric view of the printer interface detection device of FIG. 1 detecting a computer.
Figure 3:
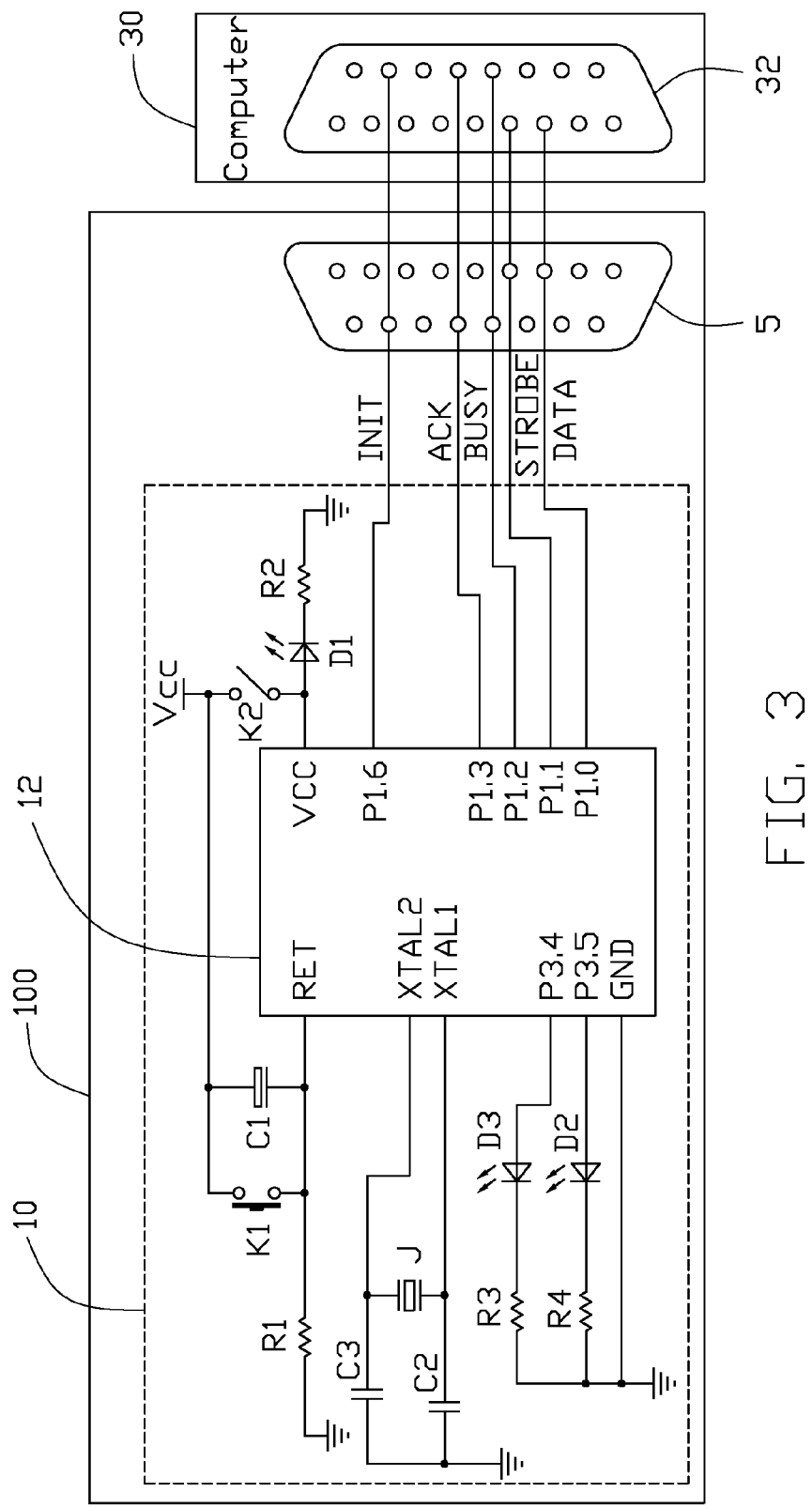
FIG. 3 is a circuit diagram of the printer interface detection device of FIG. 1.

Referring to FIGS. 1-3, an exemplary embodiment of a printer interface detection device 100 is used to simulate a printer to determine whether a printing function of a printer interface 32 of a computer 30 to be detected is normal. The printer interface detection device 100 includes a shell 1, a printer interface 5 mounted on the shell 1, a detection circuit 10 received in the shell 1, two switches K1 and K2 mounted on the shell 1, and first to third light emitting diodes (LEDs) D1-D3 mounted on the shell 1. The two switches K1 and K2, and the first to third LEDs D1-D3 are connected to the detection circuit 10. The first LED D1, displays a power status of the printer interface detection device 100. The second LED D2, displays a printing status of the printer interface detection device 100. The third LED D3, displays a detection result of the printer interface detection device 100, to allow determination of whether a printing function of the printer interface 32 of the computer 30 is normal.

The printer interface 5 is connects to the printer interface 32 of the computer 30.

The printer interface 5 of the printer interface detection device 100 includes an initialization signal pin NIT, an acknowledgement signal pin ACK, a busy signal pin BUSY, a data signal pin DATA, and a strobe signal pin STROBE, corresponding to an initialization signal pin, an acknowledgement signal pin, a busy signal pin, a data signal pin, and a strobe signal pin of the printer interface 32 of the computer 30 respectively.

The detection circuit 10 includes a microcontroller 12, resistors R1-R4, capacitors C1-C3, a crystal oscillator J, and a power source Vcc. The microcontroller 12 includes a reset pin RET, a power pin VCC, a ground pin GND, a plurality of input/output (I/O) pins P1.0, P1.1, P1.2, P1.3, P1.6, P3.4, and P3.5, an external crystal input pin XTAL1, and an external crystal output pin XTAL2. The reset pin RET of the microcontroller 12 is connected to a cathode of the capacitor C1, and is grounded via the resistor R1. An anode of the capacitor C1 is connected to the power source Vcc. The switch K1 is connected to the capacitor C1 in parallel, to reset the microcontroller 12. The power pin of the microcontroller 12 is connected to an anode of the first LED D1, and connected to the power source Vcc via the switch K2, to start the detection circuit 10. A cathode of the first LED D1 is grounded via the resistor R2. The I/O pin P1.6 of the microcontroller 12 is connected to the initialization signal pin INIT of the printer interface 5. The I/O pin P1.3 of the microcontroller 12 is connected to the acknowledgement signal pin ACK of the printer interface 5. The I/O pin P1.2 of the microcontroller 12 is connected to the busy signal pin BUSY of the printer interface 5. The I/O pin P1.1 of the microcontroller 12 is connected to the strobe signal pin STROBE of the printer interface 5. The I/O pin P1.0 of the microcontroller 12 is connected to the data signal pin DATA of the printer interface 5. The I/O pin P3.4 of the microcontroller 12 is connected to an anode of the third LED D3. A cathode of the third LED D3 is grounded via the resistor R3. The I/O pin P3.5 of the microcontroller 12 is connected to an anode of the second LED D2. A cathode of the second LED D2 is grounded via the resistor R4. The crystal oscillator J is connected between the external crystal input pin XTAL1 and the external crystal output pin XTAL2. The external crystal input pin XTAL1 is grounded via the capacitor C2. The external crystal output pin XTAL2 is grounded via the capacitor C3. The crystal oscillator J, the capacitor C2, and the capacitor C3 form a clock circuit. The ground pin GND is grounded. The initialization signal pin INIT, the acknowledgement signal pin ACK, the busy signal pin BUSY, and the strobe signal pin STROBE of the printer interface 5 can be triggered at a low level.

In use, the printer interface 5 of the printer interface detection device 100 is connected to the printer interface 32 of the computer 30. The switch K2 is turned on to initialize the detection circuit 10. When the computer 30 identifies the printer interface detection device 100, the computer 30 transmits a printing demand instruction to the printer interface detection device 100 via the data signal pin DATA. The microcontroller 12 receives the printing demand instruction, and directs the I/O pin P1.1 to output a low level signal, as a first printing status signal, to the computer 30 via the strobe signal pin STROBE of the printer interface 5, to notify the computer 30 that the printer interface detection device 100 is awaiting print data. The computer 30 transmits print data to the microcontroller 12 via the data signal pin DATA of the printer interface 5. When the I/O pin P1.0 of the microcontroller 12 receives the print data, the microcontroller 12 directs the I/O pin P3.5 to output a high level signal to turn on the second LED D2 to denote that the printer interface detection device 100 has started receiving the print data, and directs the I/O pin P1.3 to output a low level signal, as a second printing status signal, to the computer 30 to notify the computer 30 that the printer interface detection device 100 has started receiving the print data. The microcontroller 12 directs the I/O pin P1.2 to output a low level signal, as a third printing status signal, to the computer 30 via the busy signal pin BUSY of the printer interface 5 after finishing receiving the print data, to notify the computer 30 that the printer interface detection device 100 has successfully received all print data and start printing.

When the printer interface detection device 100 has finished printing, the microcontroller 12 directs the I/O pin P1.6 to output a low level signal, as a fourth printing status signal, to the computer 30 via the initialization signal pin NIT of the printer interface 5, to notify the computer 30 that the printer interface detection device 100 has finished printing. The microcontroller 12 directs the I/O pin P3.5 to output a low level signal to turn off the second LED D2 to indicate that the printer interface detection device 100 has finished printing. The computer 30 determines whether the first to fourth printing statuses of the printer interface detection device 100 are consistent with printing statuses stored in the computer 30. If so, the detection is successful and the computer 30 transmits an instruction to the microcontroller 12 via the data signal pin DATA of the printer interface 5. The microcontroller 12 directs the I/O pin P3.4 to output a high level signal to turn on the third LED D3 to denote that the detection is successful and the printing function of the printer interface 32 of the computer 30 is normal. If the first to fourth printing statuses of the printer interface detection device 100 are not consistent with printing statuses stored in the computer 30, the third LED D3 remains unlit, denoting that the detection has failed and the printing function of the printer interface 32 of the computer 30 is abnormal.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printer interface detection device for simulating a printer to detect whether a printing function of a printer interface of a computer connected to the printer interface detection device is normal, the printer interface detection device comprising:
    a printer interface to be connected to the printer interface of the computer, the printer interface comprising a plurality of input/output (I/O) pins and a data signal pin;
    a microcontroller comprising a plurality of I/O pins to connect with the corresponding I/O pins and the data signal pin of the printer interface, to output a plurality of printing status signals to the computer;
    an indicator connected to one of the plurality of I/O pins of the microcontroller;
    a first light emitting diode (LED) displaying a power status of the printer interface detection device, the first LED comprising an anode connected to a power pin of the microcontroller, and a cathode grounded; and
    a second LED displaying a printing status of the printer interface detection device, the second LED comprising an anode connected to the microcontroller, and a grounded cathode;
    wherein the microcontroller outputs the plurality of printing status signals to the computer via the corresponding I/O pins according to instructions transmitted by the computer, the computer comparing whether the plurality of printing status signals output by the microcontroller is consistent with printing status signals stored in the computer, to determine whether the printing function of the printer interface of the computer is normal, whereby when the plurality of printing status signals output by the microcontroller is consistent with the printing status signals stored in the computer, the printing function of the printer interface of the computer is normal, and the indicator is lit;
    wherein the plurality of printing status signals comprises first to fourth printing status signals, the plurality of I/O pins of the printer interface comprises an initialization signal pin, an acknowledgement signal pin, a busy signal pin, a strobe signal pin, and a data signal pin, wherein the acknowledgement signal pin, the busy signal pin, and the strobe signal pin are operable to be triggered at a low level, to output the first to fourth printing status signals, respectively;
    wherein the microcontroller outputs a low level signal, as the first printing status signal, to the computer via the strobe signal pin of the printer interface detection device, in response to the computer transmitting a printing demand instruction to the microcontroller via the data signal pin; the microcontroller outputs a low level signal, as the second printing status signal, to the computer via the acknowledgement signal pin, in response to the microcontroller receiving print data from the computer; the microcontroller outputs a low level signal, as the third printing status signal, to the computer via the busy signal pin of the printer interface detection device, in response to the controller finishing receiving the print data and the microcontroller outputs a low level signal, as the fourth printing status signal, to the computer via the initialization signal pin, in response to the printer interface detection device finishing printing;
    wherein when the printer interface detection device has started receiving the print data, the microcontroller outputs a high level signal to turn on the second LED; and when the printer interface detection device has finished printing, the microcontroller outputs a low level signal to turn off the second LED.

2. The printer interface detection device of claim 1, further comprising a shell on which the printer interface is mounted, wherein the microcontroller is mounted in the shell, the indicator is mounted on the shell, the indicator comprises an anode connected to one of the plurality of I/O pins of the microcontroller, and a grounded cathode, and the microcontroller directs the I/O pin connected to the anode of the indicator to output a high level signal after the plurality of printing status signals output by the microcontroller are consistent with the printing status signals stored in the computer, to turn on the indicator to denote that the printing function of the printer interface of the computer is normal.

3. The printer interface detection device of claim 1, further comprising a switch, wherein the microcontroller further comprises a reset signal pin connected to a power source via the switch.

4. The printer interface detection device of claim 1, further comprising a switch, wherein the microcontroller further comprises a power signal pin connected to a power source via the switch.

* * * * *